(12) United States Patent
Todd

(10) Patent No.: US 9,484,899 B2
(45) Date of Patent: Nov. 1, 2016

(54) DEBOUNCE CIRCUIT WITH DYNAMIC TIME BASE ADJUSTMENT FOR A DIGITAL SYSTEM

(71) Applicant: Dialog Semiconductor (UK) Ltd., Reading (GB)

(72) Inventor: Philip Todd, Corsham (GB)

(73) Assignee: Dialog Semiconductor (UK) Limited, Reading (GB)

( * ) Notice: Subject to any disclaimer, the term of this patent is extended or adjusted under 35 U.S.C. 154(b) by 154 days.

(21) Appl. No.: 14/495,066

(22) Filed: Sep. 24, 2014

(65) Prior Publication Data

US 2016/0087615 A1    Mar. 24, 2016

(51) Int. Cl.
*H03K 5/1254* (2006.01)

(52) U.S. Cl.
CPC .................... *H03K 5/1254* (2013.01)

(58) Field of Classification Search
CPC .......... G04G 5/00; G04G 5/005; H03K 3/00; H03K 3/013; H03K 5/00; H03K 5/1252; H03K 5/1254; H03M 11/00; H03M 11/02
USPC ...................... 327/384–386, 31–34
See application file for complete search history.

(56) References Cited

U.S. PATENT DOCUMENTS

| | | | |
|---|---|---|---|
| 4,523,104 A | 6/1985 | Norris et al. | |
| 5,027,019 A | 6/1991 | Shiohara | |
| 5,315,539 A | 5/1994 | Hawes | |
| 6,670,831 B2 | 12/2003 | Mashimo | |
| 7,579,894 B2 | 8/2009 | Kejriwal | |
| 7,847,614 B2 | 12/2010 | Taylor | |
| 8,502,593 B2 | 8/2013 | Lu et al. | |
| 2007/0150214 A1* | 6/2007 | Qin | G01R 19/2513 702/60 |
| 2011/0291799 A1 | 12/2011 | Girard, III et al. | |
| 2012/0245897 A1* | 9/2012 | Bose | G06F 11/3024 702/186 |
| 2013/0127517 A1* | 5/2013 | Chen | H03K 5/1254 327/385 |

* cited by examiner

*Primary Examiner* — John Poos
*Assistant Examiner* — David Mattison
(74) *Attorney, Agent, or Firm* — Saile Ackerman LLC; Stephen B. Ackerman; Billy Knowles

(57) ABSTRACT

A debounce circuit eliminates noise, glitches, or transient signal variations resulting from mechanical bounce occurring at a change of state of analog signals and provides a dynamic debounce period alteration and time base variation without loss of the current debounce state. The debounce circuit has a physical counter that is configured for being adjusted within a virtual counter such that the noise, glitches, or transient signal variations resulting from mechanical bounce occurring at an initiation of a change of state of an analog input signal from a source device are filtered by delaying a change of output state of the debounce circuit. The debounce circuit includes a strobe generator that produces a strobe signal that is a submultiple of a master clock that is determined by the location of the physical counter within the virtual counter that is used to increment the physical counter within the virtual counter.

34 Claims, 8 Drawing Sheets

DEBOUNCE CIRCUIT WITH DYNAMIC TIME BASE ADJUSTMENT FOR A DIGITAL SYSTEM

TECHNICAL FIELD

This disclosure relates generally to a circuits and methods for the elimination of transient signal variations resulting from the activation and deactivation of electronic and mechanical devices such as switches and sensors. More particularly, this invention relates to circuits and methods for dynamically adjusting time periods employed in the elimination of the transient signal variations.

BACKGROUND

Semiconductor devices often have analog signals from off chip or from an embedded analogue function that must be processed in the digital domain. Noise, glitches, or transient signal variations resulting from mechanical bounce occurring at the initiation of a change of state of the analog signals must be removed before the signal values are further processed.

Debouncing circuits and methods for removing the noise, glitches, or transient signal variations resulting from the mechanical bounce are well known in the art. A classic debouncing method is a resistor-capacitor (RC) network where a time constant of an RC network determines a hold from activation time once a switch has been activated to an open or closed state. During the initial period of the activation, the mechanical switch will "bounce" between the open and closed state until after a period of time the switch assumes the new state. To mask this period and prevent errors in the function monitoring the switch, the time constant of the RC network is chosen to be sufficiently large to be longer than the activation or deactivation period.

In digital systems, counting at a fixed frequency to a fixed value typically performs this debounce function. The count is restarted each time the signal to be debounced changes value. Only when this counter has reached a predetermined value is the (now stable) signal value allowed to pass to the output of the debounce circuit. The optimum circuit provides the required debounce functionality while keeping latency of the signal to a minimum. A digital form of a debounce circuit is described in U.S. Pat. No. 4,523,104 (Norris, et al.). The debounce circuit eliminates transient pulses generated by bouncing mechanical contacts within a switch. A shift register accepts a series of binary input signals from the switch and propagates the signal out the register in parallel to a logic device for generating a resultant binary signal corresponding to the switch's debounced signal state.

U.S. Pat. No. 5,315,539 (Hawes) describes a method and apparatus for debouncing signals. The apparatus provides lockout filters for debouncing signals that include an input part for receiving a plurality of input signals from switches, a microprocessor and an output part. The filters simultaneously process a plurality of input binary signals in parallel according to a sequence of mask values that individually adjust the filter response function for each of the individual filter channels. A multichannel filter has a filter simultaneously filtering each input signal of a plurality of input signals, the filter including a plurality of independent filter channels, each independent filter channel filtering a corresponding input signal of the plurality of input signals to produce a corresponding output signal of a plurality of output signals. The multichannel filter also has a mechanism for independently adjusting a filter response time of each independent filter channel.

FIG. 1 is a schematic diagram of a debounce circuit of the prior art. The data 10 is a signal that originates from a mechanical or analog circuit source that may contain noise, glitches, or the transient signal variations resulting from the mechanical bounce particularly at the beginning of a change from one particular state to at second state. In the case of a mechanical switch, the switch maybe opening or closing. During this initiation of a new state, the switch may make and break contact for a number of times. In some instances, the time that the mechanical or analog circuit source changes from the first state to the second state may be sufficiently slow that the input circuitry provides much apparent logic hash or oscillations resulting from the analog signals remaining in illegal logic regions of the receiving circuitry for a long time duration.

The data 10 is applied to the D-type Flip-Flops 15 and 20 to eliminate some of the logic hash or oscillations between the clock CK pulses. The data having any or all of the logic hash or oscillations removed is applied to an edge detector 25. The edge detector consists of a third D-type Flip Flop 27 that receives the data from the output of the second D-type Flip-Flop 20 and applies it to the exclusive OR circuit 29. The other input of the exclusive OR circuit 29 is the output of the D-type Flip-Flop 20. The output of the third D-type Flip Flop 27 delays the data output of the output of the second D-type Flip-Flop 20 by one clock CK cycle. The exclusive OR circuit 29 determines if the outputs of the second D-type Flip-Flop 20 and the third D-type Flip Flop 27 are not equal. If the outputs of the second D-type Flip-Flop 20 and the third D-type Flip Flop 27 are not equal, the count/reset output 30 of the exclusive OR circuit 29 is turned on causing the N-bit counter 35 to be reset and start counting from it starting value. The clock 40 increments the counter and the count output 45 of the N-bit counter 35 contains the current count value. The count output 45 is applied to the threshold comparator 55 to be compared with the threshold value 50. When the count value 45 is less than the threshold value 50 the output of the threshold comparator 55 is at a state (0) indicating that the count value 45 is less than the threshold value 50. When the count value 45 is equal to or greater than the threshold value 50, the output of the comparator 55 is at a state (1) indicating this. The output of the comparator 55 is applied to the select gate of the selector 60. When the count value 45 is less than the threshold value 50, the output data 70 from the fourth D-type Flip Flop 65 is fed back to the first input (0) of the selector 60 that is then applied to the fourth D-type Flip Flop 65 to maintain the debounced data output 70 of the fourth D-type Flip Flop 65 at the original level of the data prior to the detection of the transition edge. When the count value 45 is equal to or greater than the threshold value 50, the output from the comparator 55 applied to the selector 60 sets the selector 60 to transfer the signal from the second input (1) to the output of the selector 60. When the time determined by the N-bit counter 35 has elapsed after the last bounce detected by the edge detector 25, the data at the output of the second D-type flip flop 20 is transferred to the data input D of the fourth D-type Flip Flop 65 and thence to the debounced data output 70.

The source of the input data signal 10 may vary depending on the application, user requirements or environment. It is desirable to be able to change the debounce duration within a circuit application dynamically. Being able to support both a long and a short debounce time with the same circuit running at a fixed rate, would require that the number of bits of the N-bit counter 35 be constructed to support the longest debounce duration. This results in redundant, unused circuitry whenever the long debounce setting is not used.

SUMMARY

An object of this disclosure is to provide circuits and method for eliminating noise, glitches, or transient signal variations resulting from mechanical bounce occurring at an initiation of a change of state of analog signals that supports a dynamic debounce period alteration and time base variation without loss of the current debounce state.

To accomplish at least this object, a debounce circuit has a physical counter that is configured for being disposed within a virtual counter such that noise, glitches, or transient signal variations resulting from mechanical bounce occurring at an initiation of a change of state of an analog input signal from a source device are filtered. The debounce circuit receives a source selection signal to determine a source device for the analog signal with noise, glitches, or transient signal variations resulting from mechanical bounce occurring at an initiation of a change of state of the analog signals.

At the initiating of power to the debounce circuit, the debounce circuit is initialized to a maximum period of the holding the output signal of the debounce circuit from changing state when the source device has initiated a change of state of the analog signal. The physical counter is initialized to the location within the virtual counter for providing the necessary delay for filtering the noise, glitches, or transient signal variations resulting from mechanical bounce occurring at an initiation of a change of state of the analog signals. Upon the initialization of the debounce circuit, the physical counter is reset to a beginning state.

The debounce circuit has an edge detector that determines that the analog signal from the source device is changing state. When the edge detector determines that the analog signal is changing state, the debounce circuit resets the physical counter to the beginning state.

The debounce circuit includes a strobe generator that produces a strobe signal that is a submultiple of a master clock of the debounce circuit. The submultiple is determined by the location of the physical counter within the virtual counter. The location of the physical counter being such that the beginning binary digit of the physical counter is located at the virtual location in the virtual counter where two raised to the virtual location of the beginning binary digit of physical counter is the submultiple of the clock determining the strobe time.

When the edge detector determines that the analog signal is not changing state, the strobe is examined to determine if it as at an active state (1). When the strobe is not the active state (1), the debounce circuit waits for the next clock. At the receiving of the next active edge of the clock, the debounce circuit determines if a change in the state of the input analog signal has been detected. If the change in state of the input analog signal is detected, the physical counter is reset. At the next rising clock, the debounce again determines if another change in state is occurring. If it is not, the strobe signal is examined to determine it is at the active state (1). If it is now at the active state, the debounce circuit examines the debounce parameters to determine if a debounce threshold count value determining the maximum count of the physical counter is changed. Also, the strobe time is modified if the debounce parameters are changed. In the case of an initial pass after the initialization at the activating the power to the circuit, device configuration will have to be changed unless the debounce parameters are designated to be at the longest possible debounce time. With the change in debounce parameter, the debounce threshold is updated and the physical counter is relocated appropriately within the virtual counter based on the time base of the noise, glitches, or transient signal variations resulting from mechanical bounce occurring at an initiation of a change of state of an analog input signal of the source device.

The output of the debounce circuit is compared with the analog input signal from the source device. If the output of the debounce circuit and the analog input signal are not the same, the debounce circuit determines if an overflow occurred when the relocation of the physical counter has occurred within the virtual counter or the contents of the physical counter was equal to or greater than the debounce threshold count value. If an overflow did not occur or the content of the physical counter was not equal to or greater than the debounce threshold count value, the physical counter is incremented.

When the active edge of the clock arrives, a change is state of the analog signal is not detected, and the strobe signal is active, the debounce parameters are again examined by the debounce circuit to determine if they have changed. If the debounce parameters have not changed, the output of the debounce circuit is compared with the analog input signal from the source device. If the output of the debounce circuit and the analog input signal are not the same, the debounce circuit determines if an overflow occurred when the relocation of the physical counter transpired within the virtual counter or the contents of the physical counter was equal to or greater than the threshold time. If an overflow did occur or the content of the physical counter was equal to or greater than the threshold time, the new data from the analog signal is transferred to the output of the debounce circuit and the physical counter is reset. The debounce circuit cycles through the detecting an edge when the strobe is an active state (1) and incrementing the counter until the debounce parameters change and there is an overflow or the physical counter is equal to or greater than the threshold value.

DETAILED DESCRIPTION

A circuit for debouncing signals utilizes the concept of a virtual counter of the required bit-width (N), where the debounce period and time base may be dynamically changed without losing the current state of debounce. The 'virtual' counter has a range sufficient to encompass the time of the longest debounce time required by an input analog signal having noise, glitches, or transient signal variations resulting from mechanical bounce occurring at the initiation of a change of state of the analog signals. A 'physical' counter is implemented that is equal in size to or smaller than the virtual counter and provides a window into the virtual counter. A change in the debounce time base moves the effective position of the physical counter window within the virtual counter.

The implementation of a restricted size physical counter provides a means to count larger debounce times without the area and cost penalties of a full range counter. Merely increasing the sample period in lieu of using more counter bits is sub-optimal because resolution is lost and latency increased for signals requiring short debounce times. Sliding the counter over a window into a larger virtual range enables the counter size to be limited while only reducing resolution for large debounce times.

The debounce circuit has three configuration/control inputs to modify the location of the physical counter within the virtual counter. The three configuration/control inputs are a time base indicating the location of the physical counter within the virtual window, a debounce threshold indicating the count of the physical counter at which the debounce time has elapsed, and counter update strobe that activates at a submultiple of the circuit clock frequency.

Figure 1:
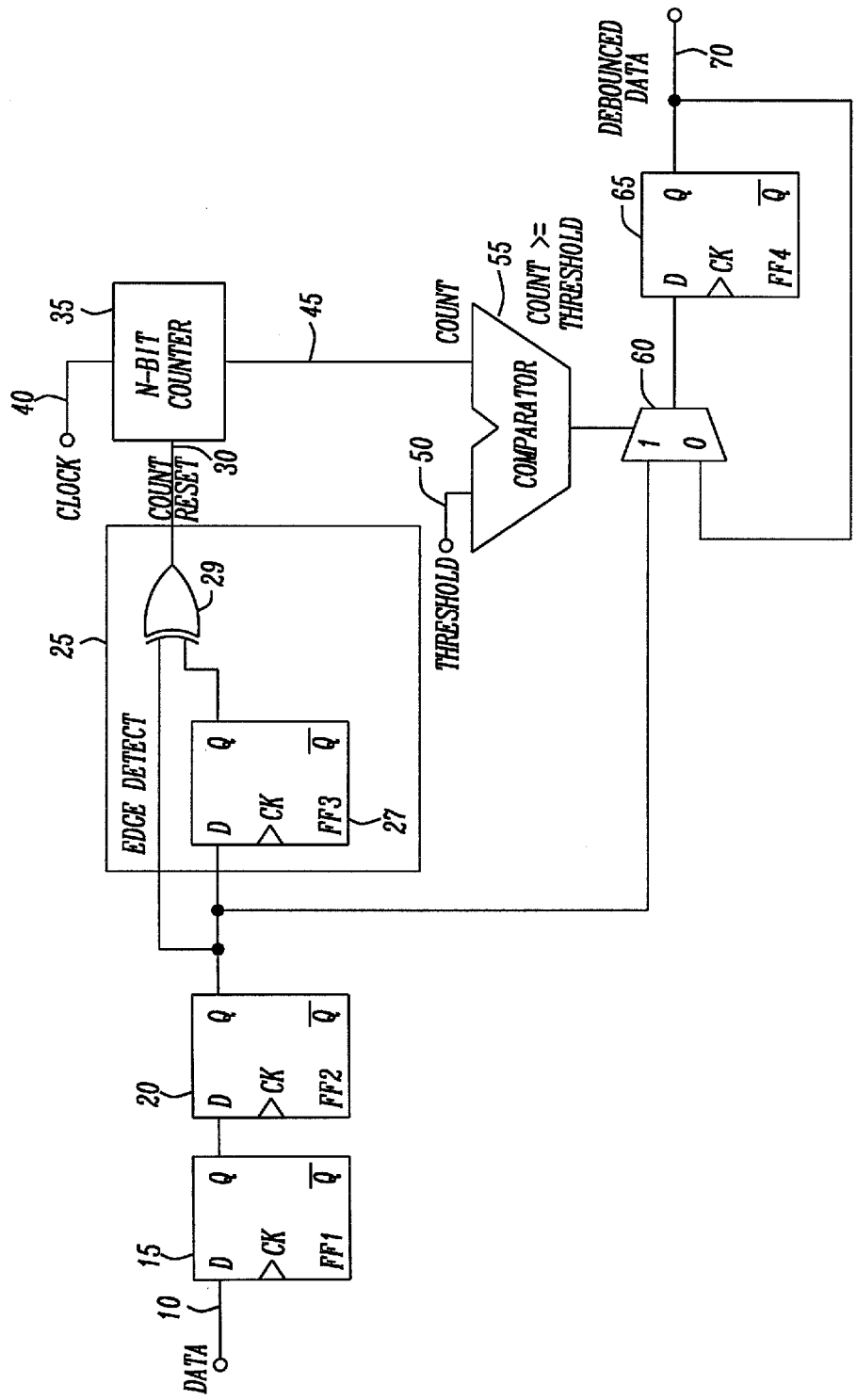
FIG. 1 is a schematic diagram of a debounce circuit of the prior art.
Figure 2:
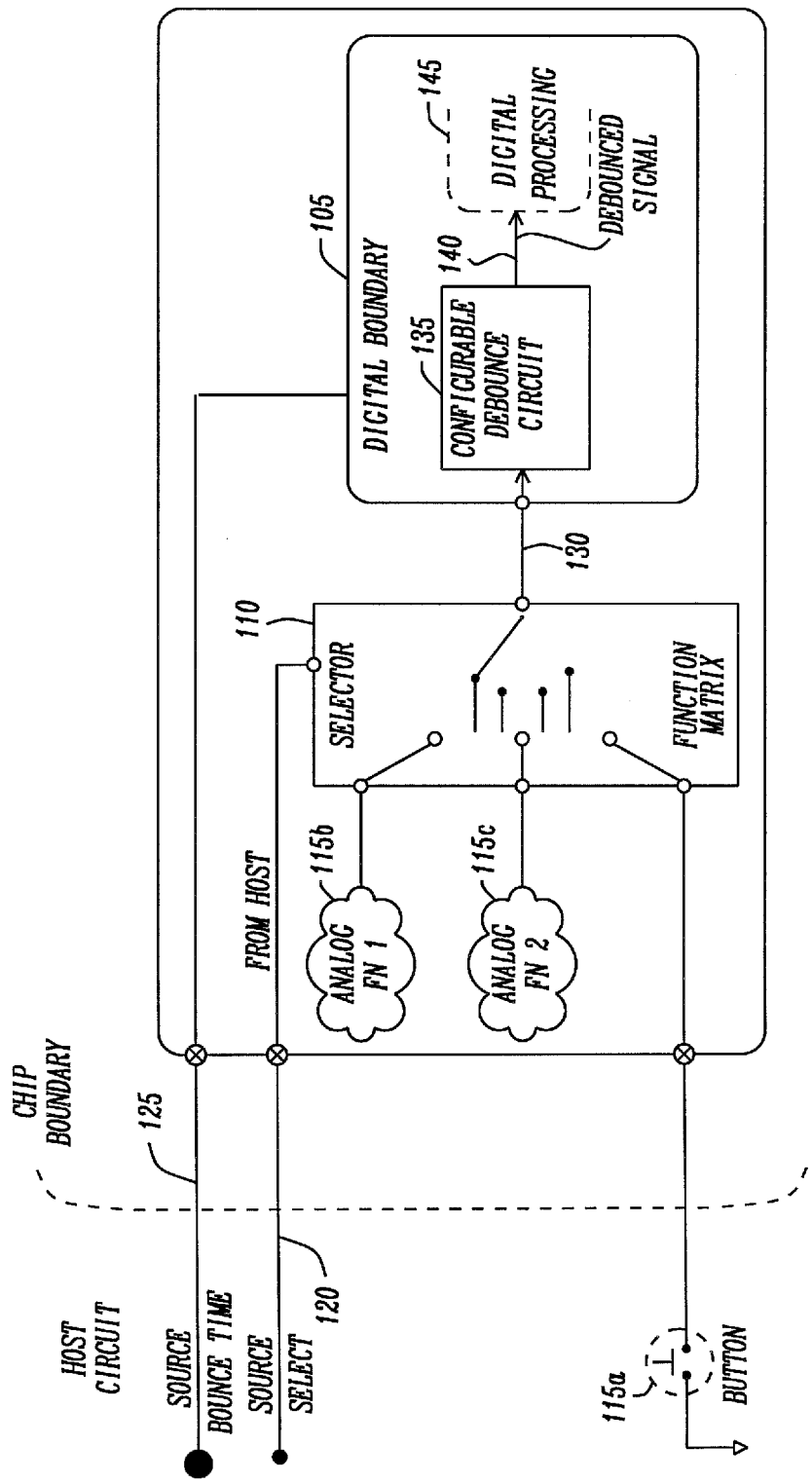
FIG. 2 is a block diagram of a system incorporating a configurable debounce circuit embodying the principals of the present disclosure.

FIG. 2 is a block diagram of a system 100 incorporating a configurable debounce circuit 135 embodying the principals of the present disclosure. The configurable debounce circuit 135 is incorporated within the boundary of a system 100 on at least one integrated circuit chip. The system 100 has a digital processing region 145 that receives a debounced signal 140 from the configurable debounce circuit 135. The configurable debounce circuit receives the analog signal 130 that has noise, glitches, or transient signal variations resulting from mechanical bounce occurring at the initiation of a change of state of the analog signal 130. The analog signal 130 is chosen by a selector switch 110 that is connected to multiple analog signal sources 115*a*, 115*b*, and 115*c* that generate the noise, glitches, or transient signal variations resulting from mechanical bounce occurring at the initiation of a change of state. The analog signal source 115*a* is illustrated as a "push button" switch that is configurable to operate, for example, as a press and release switch or a press for >1 second and release for initiating a different modes of operation. The configurable debounce circuit 135 is configured to include the button press timing to distinguish between a press and release operation and the press and hold operation.

The analog functions 115*b*, and 115*c* may operate such that they have sufficiently slow state changes that their receiving circuitry will generate noise or glitches during the change of state of the receiving circuitry. Further, the sensor of the analog functions 115*b*, and 115*c* may be operating such that any state change also generate the noise or glitches. The selector 110 receives a source select signal 120 from the host circuit for choosing one of the multiple analog signal sources 115*a*, 115*b*, and 115*c*. The host at the same time transmits a source bounce time signal 125 indicating the amount of time the selected source analog signal 130 is to be maintained at its original state when a state change occurs to eliminate the noise, glitches, or transient signal variations resulting from mechanical bounce occurring at the initiation of the change of state of the selected multiple analog signal source 115*a*, 115*b*, and 115*c*.

Figure 3:
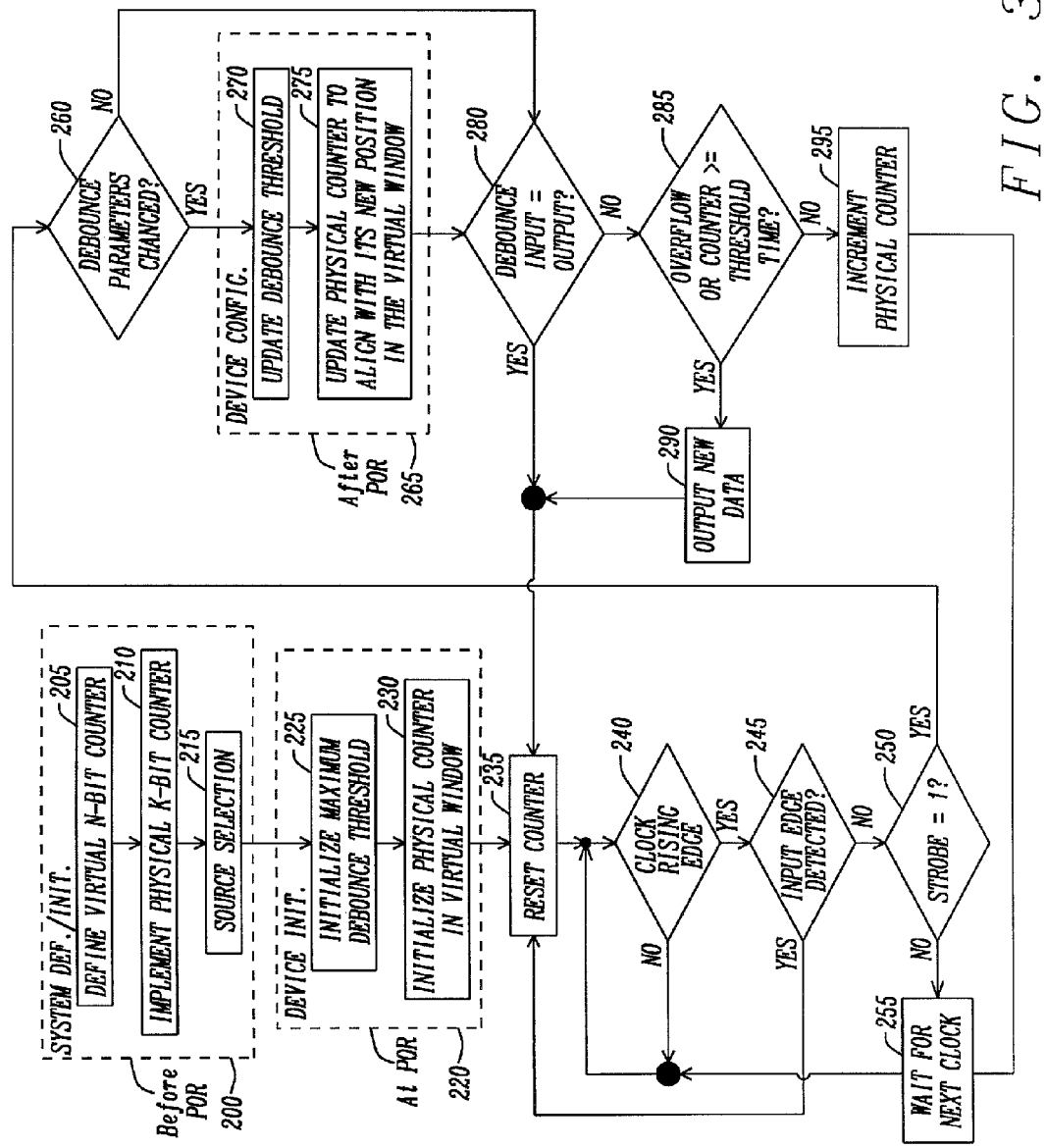
FIG. 3 is a flowchart of a method for eliminating noise, glitches, or transient signal variations resulting from mechanical bounce occurring at an initiation of a change of state of analog signals embodying the principals of the present disclosure.

FIG. 3 is a flowchart of a method for eliminating noise, glitches, or transient signal variations resulting from mechanical bounce occurring at an initiation of a change of state of analog signals from the multiple analog signal sources 115*a*, 115*b*, and 115*c* of FIG. 2. The method begins by defining and initializing the system (Box 200) prior to the power initialization of the system. A virtual counter is defined (Box 205) such that the maximum time that the virtual counter takes to count from its least significant bit to its most significant bit is sufficiently long to meet the maximum time for filtering the noise, glitches, or transient signal variations resulting from mechanical bounce of the analog signal sources 115*a*, 115*b*, and 115*c* of FIG. 2. The physical counter that is located within the virtual counter for performing the count is defined (Box 210). The physical counter is implemented to be equal in size to or smaller than the virtual counter and provides a window into the virtual counter. The host system selects (Box 215) one of the analog signal sources 115*a*, 115*b*, and 115*c* to be monitored for a change in state that cause the noise, glitches, or transient signal variations resulting from mechanical bounce.

After the power initiation, the debounce circuit is initiated (Box 220) with the maximum debounce period initialized (Box 225) by setting the debounce threshold to its maximum level. The physical counter is initialized (Box 230) to be set at a location within the virtual counter to accomplish correct for the maximum debounce period. The physical counter is reset (Box 235). The system clock is monitored (Box 240) to determine when a rising edge has arrived. At the arrival of the rising edge of the clock, the analog signal is monitored (Box 245) for an edge indicating a change of state of the analog signal. A physical counter strobe is monitored (Box 250) to determine if it has an active state (1). If the strobe is not at the active state (1), the debounce circuit waits (Box 255) for the next clock. When monitoring (Box 240) the clock for the rising edge, the rising edge is detected and when monitoring the physical counter strobe indicates that the strobe signal is at the active state (1), the active debounce parameters are compared (Box 260) to determine if they are equal to the debounce parameters of the selected source as indicated by the source bounce time signal. If the debounce parameters are different from those of the selected source, the debounce circuit is reconfigured (Box 265) by updating (Box 270) the debounce period such that the threshold count indicates the correct elapsed time for the debounce period. The physical counter is updated (Box 275) to align with its new window position in the virtual counter. On the initial operation at the power on reset, the debounce threshold is set (Box 225) to its maximum value and the physical counter is placed (Box 230) to enable a maximum count. Therefore at the first cycle through the process, the debounce parameters will be changed to meet the requirements of the selected analog signal source 115a, 115b, and 115c. The debounce circuit may be reconfigured to meet the requirements of a newly selected analog signal source 115a, 115b, and 115c.

The timer strobe is generated based on the location of the least significant bit of the physical counter within the virtual counter and sampled on every rising clock edge. The width of the timer strobe is the width of a single clock pulse. If the time base requires that the timer strobe is active (1) on every clock then it may be tied to an active state (1). To ensure that the strobe is stable when it is sampled, in some embodiments, it is updated on the negative clock edge.

Once the debounce circuit is reconfigured (Box 265) or if there is no reconfiguring of the debounce circuit, the input of the debounce circuit and the output of the debounce circuit are compared (Box 280). If the input and output of the debounce circuit are equal, the physical counter is reset (Box 235). Upon detection (Box 240) of the rising edge of the clock, no edge detection (Box 245) of the input data, the physical counter strobe determined (Box 250) to have an active state (1), and the debounce parameters being reviewed (Box 260) for change, the input and output of the debounce circuit are compared (Box 280) for being equal. If they are not equal, the input of the debounce circuit has changed state. It is determined (Box 285) if the physical counter has overflowed or the physical counter is equal to or greater than the time threshold count. If the overflow has occurred or the time threshold count is met or exceeded, the output is set (Box 290) to the value of the input of the debounce circuit and the counter is reset (Box 235). The operation process then continues. If the overflow has not occurred or the time threshold count is not met or exceeded, the physical counter is incremented (Box 295) and the process then continues to examine (Box 240) the clock for the rising edge, examining (Box 245) the input of the debounce circuit for a rising edge of the input and continuing the process. The clock and timing strobe are AND'ed together and the result is used to enable incrementing (Box 295) of the physical counter and setting (Box 290) of the output to the new data.

Figures 4A, 4B, 4C:
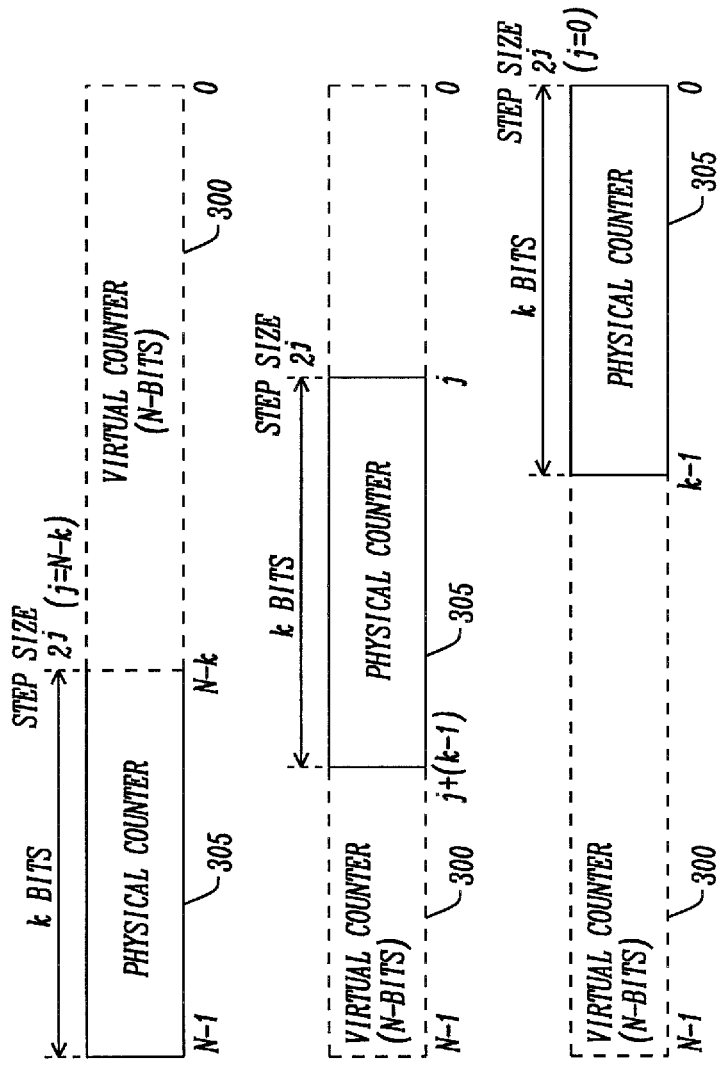
FIGS. 4a, 4b, and 4c, are plots showing the structure of a virtual counter and physical counter placed within the virtual counter as implemented within a configurable debounce circuit embodying the principals of the present disclosure.

FIGS. 4a, 4b, and 4c, are plots showing the structure of a virtual counter and physical counter 305 placed within the virtual counter 300 as implemented within a configurable debounce circuit implementing the method of FIG. 3. The virtual counter 300 is structured with N bits and the physical counter 305 is structured with k bits where k is less than or equal to N.

In FIG. 4a, the physical counter 305 is located at the least significant bits of the virtual counter 305. For simplicity, it is assumed that the virtual counter 300 can increment at the input clock rate. Therefore the counter update strobe can be set to logic state (1) such that the physical counter 305 will increment every clock. The k bit threshold range is 0 to $2^k-1$ in steps of $2^0$ and the time base setting is 0. That is the physical counter 305 is shifted 0 bits along the virtual counter 300.

In FIG. 4b, the second position offsets the physical counter j bits. This time the update strobe should pulse once every $2^j$ clock cycles, the time base setting is j (shift of j bits) and the threshold, which is still k bits wide, has a range of 0 to $2^{j+k}-2^j$ in steps of $2^j$ In FIG. 4cThe third position aligns the physical counter with the top of the range. The update strobe pulses every $2^{N-k}$ cycles, the time base shift setting is N-k and the k bit threshold has a range from $2^{N-k}$ to $2^N-2^{N-k}$ in steps of $2^{N-k}$.

In the general case shown in Table 1, for an N-bit virtual counter [N−1:0], where bit [0] could toggle at the clock rate T:

TABLE 1

| Clock period | Physical counter bits (<=N) | Physical counter offset within virtual window. | Debounce resolution (update strobe period) | Debounce range |
|---|---|---|---|---|
| T | k | j | $2^j$ T | $2^j$ T ⇨ $(2^{j+k}-2^j)$*T |

Table 2 shows possible debounce configurations if the virtual counter 300 has seventeen bits (N=17), the physical counter 305 has ten bits (k=10) and the period for the clock cycle (T) is 32 µs.

TABLE 2

| Physical counter offset within virtual window j | Debounce resolution (update strobe period) $2^j$ T | Debounce range $2^j$ T ⇨ $(2^{j+k}-2^j)$T |
|---|---|---|
| 0 | $2^0$ T = 32 µs | 32 µs ⇨ 32.736 ms |
| 3 | $2^3$ T = 256 µs | 256 µs ⇨ 261.8 ms |
| 5 | $2^5$ T = 1.024 ms | 1.024 ms ⇨ 1.047 s |
| 7 | $2^7$ T = 4.096 ms | 4.096 ms ⇨ 4.19 s |

When the least significant bit (0) of the physical counter 300 is set to the least significant bit (0) of the virtual counter 300 as shown in FIG. 4a, the physical counter offset is zero and therefore the debounce resolution is equal to the clock period T or 32 µs. The debounce range extends from 32 µs to $(2^{10}-1)$*32 µs or 32.736 ms. Similarly, when the least significant bit (0) of the physical counter 300 is set to the third bit (3) of the virtual counter 300 as shown in FIG. 4b, the physical counter offset is three and therefore the debounce resolution is equal to the $2^3$*clock period T or 256 µs. The debounce range extends from 256 µs to $(2^{13}-2^3)$*32 µs or 261.8 ms. When the least significant bit (0) of the physical counter 300 is set to the fifth bit (5) of the virtual counter 300 as shown in FIG. 4b, the physical counter offset is five and therefore the debounce resolution is equal to the $2^5$*clock period T or 1024 ms. The debounce range extends from 1024 ms to $(2^{15}-2^5)$*32 µs or 1.047 s. Finally, when the least significant bit (0) of the physical counter 300 is set to the seventh bit (7) of the virtual counter 300 as shown in FIG. 4c, the physical counter offset is seven and therefore the debounce resolution is equal to the $2^7$*clock period T or 4096 ms. The debounce range extends from 1024 ms to $(2^{17}-2^7)$*32 µs or 4.19 s.

Figure 5:
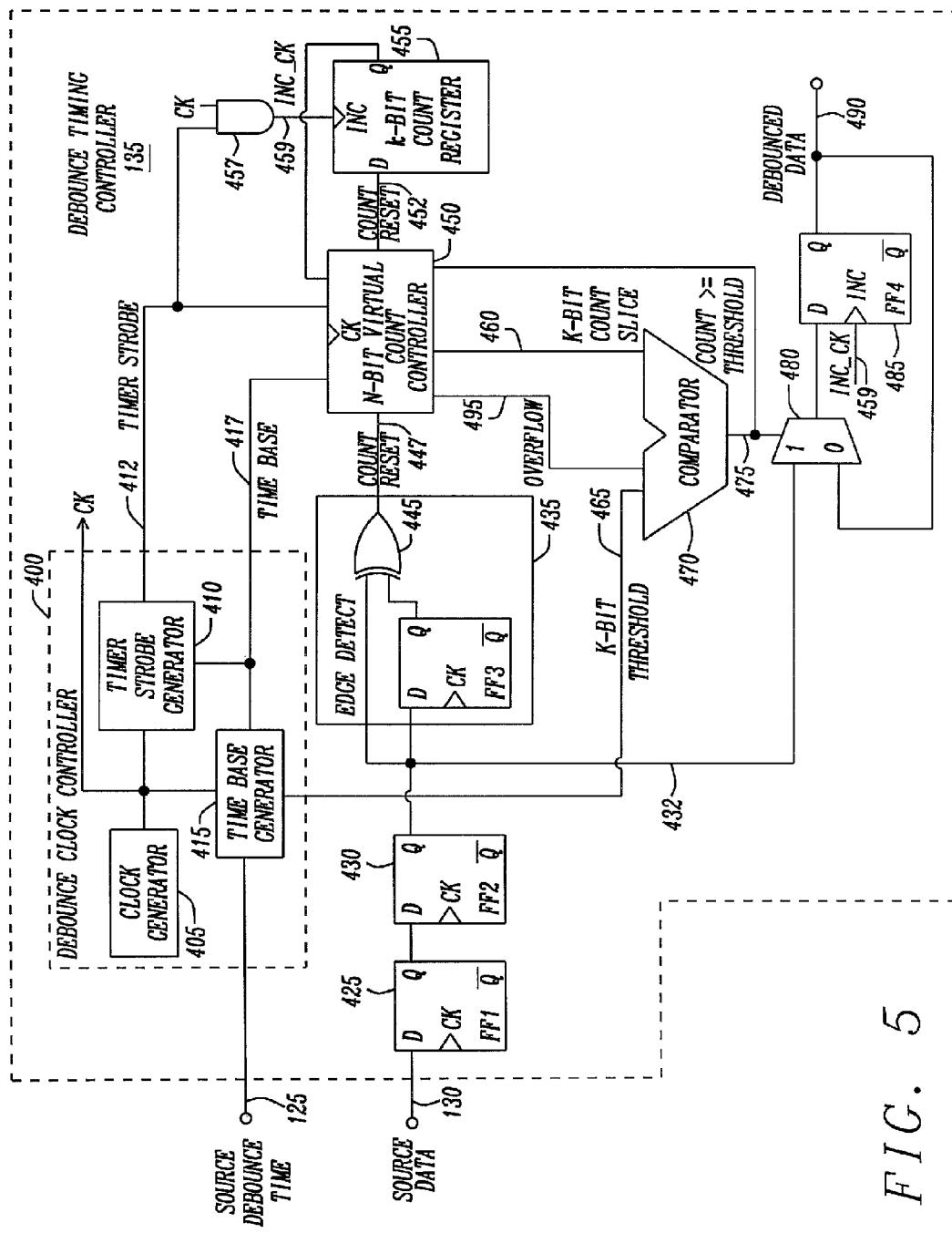
FIG. 5 is a schematic diagram of a configurable debounce circuit embodying the principals of the present disclosure.

FIG. 5 is a schematic diagram of a configurable debounce circuit 135 of FIG. 2 embodying the principals of the present disclosure. A debounce clock controller 400 has a clock generator that provides the base clocking signal CK that is distributed to throughout the debounce timing controller 135 for synchronizing its operation. The debounce clock controller 400 receives the source debounce time signal 125 from the host system. The source debounce time signal 125 is applied to a time base generator 415 to generate the time base signal 417 of the physical counter offset and the threshold value 465. A timer strobe generator 410 receives the base clocking signal CK and the time base signal 417 to produce the timer strobe 412. The timer strobe 412 is generated based on the location of the least significant bit of the physical counter within the virtual counter as defined by the time base signal 417 and sampled on every rising edge of the clock CK. The width of the timer strobe 412 is the width of a pulse of the clock CK. If the time base signal 417 requires that the timer strobe 412 is active (1) on every clock CK then it may be tied to an active state (1). To ensure that the timer strobe 412 is stable when it is sampled, in some embodiments, it is updated on the negative edge of the clock CK. The timer strobe determines when the physical counter increments when it is placed within the virtual window.

The source data 130 from the selected analog source is applied to the data input D of the first D-type flip flop 425. The output Q of the first D-type flip flop 425 is connected to data input D the second D-type flip flop 430 to provide the next source data 432 that is synchronized to the clock CK. The clocking signal CK captures the source data 130 from the selected analog source and synchronizes it with the clocking signal CK. The output Q of the second D-type flip flop 430 is connected to an edge detector 435 to sense when the source data 130 is changing for one data state to a second data state. The edge detector has a third D-type flip flop 440 that has an input D that receives the synchronized source data from the output Q of the second D-type flip flop 430. The output Q of the third D-type flip flop 440 delays the synchronized source data by one cycle of the clocking signal CK. The synchronized source data from the output Q of the second D-type flip flop 430 and the delayed synchronized source data from the output Q of the third D-type flip flop 440 are applied to the input of an exclusive-OR circuit 445. The output of the exclusive-OR circuit 445 is a count/reset signal 440 that is active (1) when the current synchronized source data from the output Q of the second D-type flip flop 430 is different than the delayed synchronized source data from the output Q of the third D-type flip flop 440. The count/reset signal 440 is transferred to the virtual count controller 450 to reset the physical counter at the detection of a change of state of the source data 130.

The clock CK and the timer strobe 412 are transferred to the virtual count controller 450. When the rising edge of the clock CK occurs, the timing strobe is at an active state (1), and no change in state of the source data 130 has occurred, the next count output 452 is transferred to the count register 455 such that the count register 455 is incremented. The timer strobe 412 and the clock CK are the inputs to the AND circuit 457 to provide the increment clock 459 to the K-bit count register 455. The increment clock INC of the K-bit count register 455 is a pulse the width of the clock pulse CK occurring when the timer strobe 412 is active (1). The increment clock 459 has a repetition rate that is determined by the least significant bit of the location of K-bit count register 455 within the virtual counter based on the time base 417.

The current count of the K-bit count register 455 is fed back as input to the virtual count controller 450. The current count is passed through the virtual count controller 450 to the comparator 470 where the count slice 460 is compared with the debounce threshold 465 to determine if the debounce time has elapsed. The count indicator output 475 of the comparator 470 is connected to a debounce data selector 480. If the count indicator output 475 denotes that the count slice 460 is not greater than the debounce threshold 465, debounce data selector selects the current debounce data 490 to be fed to the data input D of the fourth D-type flip flop 485. At the next count clock CK, the output Q remains at the current debounce data 490. If the count indicator output 475 denotes that the count slice 460 is greater than the debounce threshold 465, debounce data selector 480 selects the next source data 432 to be fed to the data input D of the fourth D-type flip flop 485. At the next count clock CK, the output Q is changed to become the next debounced source data 432.

If there is a change in the time base signal 417, the virtual count controller 450 determines where in the virtual counter the K-bit count register 455 is to be placed. If the time base signal 417 indicates that the time base is getting smaller, the K-bit count register 455 is left shifted. If the contents of the K-bit count register 455 cause an overflow of the K-bit count register 455, an overflow signal 495 is transmitted to override the comparator and the output 475 of the comparator 470 to force debounce data selector 480 to select the next source data 432 to be fed to the data input D of the fourth D-type flip flop 485.

Figure 6:
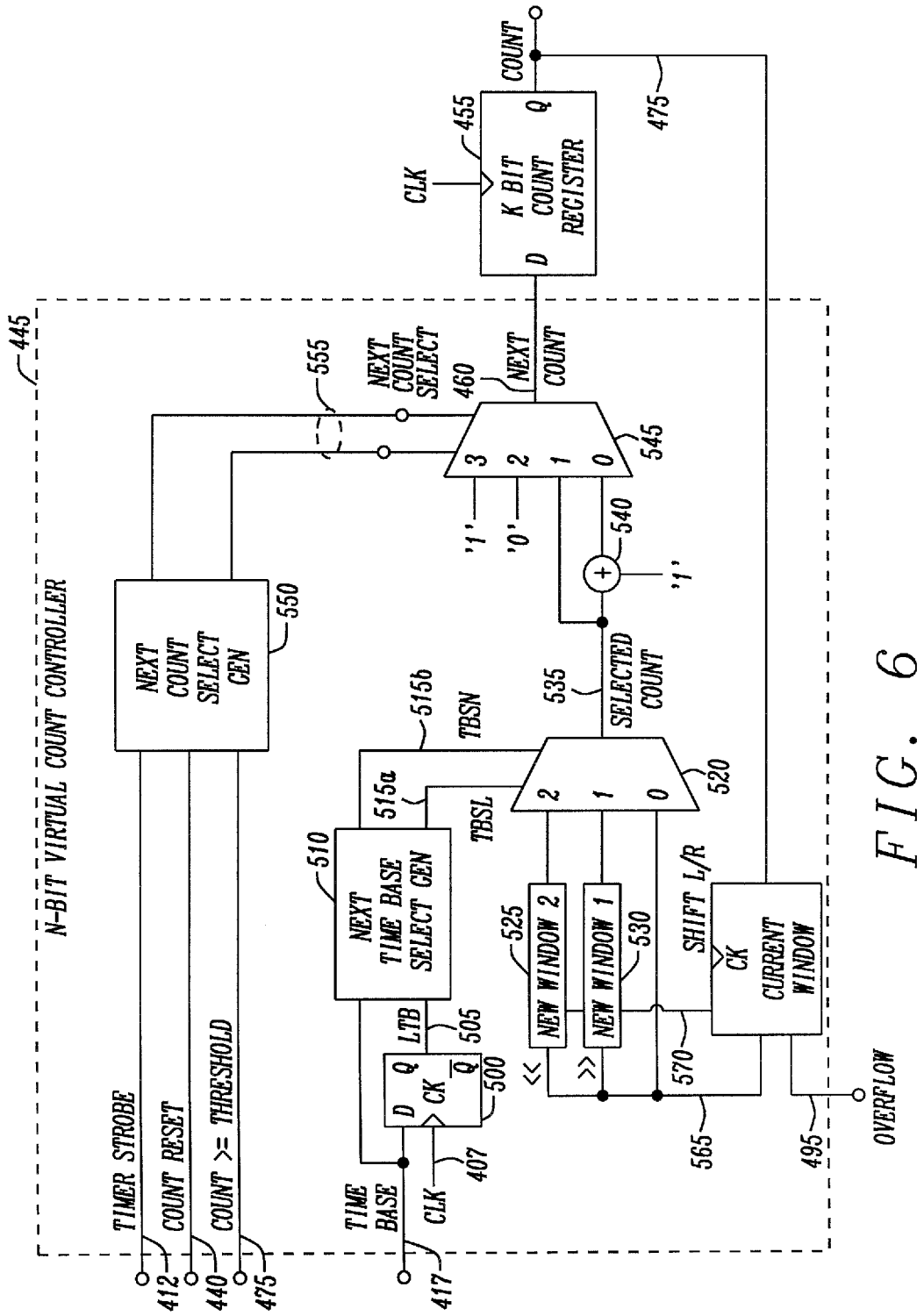
FIG. 6 is a schematic diagram of an N-bit virtual count controller of the configurable debounce circuit embodying the principals of the present disclosure of FIG. 5.

FIG. 6 is a schematic diagram of an N-bit virtual count controller 450 of the configurable debounce circuit 135 of FIG. 5. The time base signal 417 is transferred to the data input D of the D-type flip flop 500 and the clock 407 is applied to the clock input CK of the D-type flip flop 500. The output Q of the D-type flip flop 500 is the last time base indicator signal 505 that is applied to a first input of the next time base generator 510. The time base signal 417 is also transferred to a second input of the next time base generator 510. The last time base signal 505 and the next time base signal are compared in the next time base generator 510 to determine the count selections.

Furthermore, the time base signal 417 is employed for determining the new window registers 525 and 530 for the physical counter, as implemented by the K-bit count register 455, within the virtual counter. The next time base selection 417 is compared with the previous time base selection 505 to decide where the physical count should be placed. The current count 475 from the K-bit count register 455 is an input to the first input connection (0) of the selected count multiplexer 520.

The new windows 525 and 530 are calculated based on the difference between previous time base signal 505 and current time base signal 417. This calculation may require that the contents of the K-bit count register 455 to shifted left (time base getting smaller) or shifted right (effectively a truncation with time base getting larger).

In various embodiments, where there may be a limited subset of allowed time base values, barrel shifters may be replaced by a set of window values 525 and 530 with fixed shifts connected to the input of a multiplexer, thus reducing greatly the size of the resulting circuit.

An overflow is easily detected and can only happen when the time base signal 417 is getting smaller and a left shift of the contents of the K-bit count register 455 is implemented. Any '1' bits shifted off the end of the shifter indicate an overflow. As a simple example, a 3 bit counter value is '111' at the most significant bits of the contents of the K-bit count register 455 in the current time base. A new time base signal 417 requires a single bit left shift, giving a new value of '1110'. The new 3 bit value of the most significant bits of the contents of the K-bit count register 455 is now '110' and the bit shifted out is also '1' indicating that overflow has occurred. The overflow signal 495 is then set.

The current count 475 is also an input to each of the new window registers 525 and 530. The shift amount (j) from the time base signal 417 determines the amount of shifting for each of the new window registers 525 and 530. The new window register 525 shifts the physical counter toward the most significant bit of the virtual counter. The new window register 530 shifts the physical counter toward the least significant bit of the virtual counter. The new window register 530 is connected to the second connection (1) of the selected count multiplexer 520 and the new window register 525 is connected to the third connection (2) of the selected count multiplexer 520. If the new time base signal 515$b$ is equal to the last time base signal 515$a$, the current count 475 is transferred from the K-bit count register 455 to the selected count output 535 of the selector 545.

The number of shifted bits within the K-bit count register 455 depends on the relationship between the time base settings 417. The example of FIG. 6 illustrates a system with two time bases (the new window registers 525 and 530). This can be extended for multiple time base systems with multiple new window registers added to as inputs to the selected count multiplexer 520. In other embodiments, the selected count multiplexer 520 could be replaced with a configurable shift register, with selected count created by shifting count left or right by a number of bits (x) determined by a function of the next time base and last time base.

The timer strobe signal 412, the count reset signal 440, and the count indicator signal 475 are applied to the next count select generator 550 to determine the next count select signals 555. The next count select signals 555 are the select inputs for the next count selector 545. The selected count output 535 is connected to the input of the increment circuit 540. The increment circuit 540 is an adder circuit that has one of the inputs set to the value of a binary "1". The output of the increment circuit 540 is the first input of the next count selector 545. The selected count output 535 is also connected directly to the next count selector 545 as the second input of the next count selector 545. The third input of the next count selector 545 is connected to be a binary '0' and the fourth input of the next count selector 545 is connected to be a binary '1'.

The next count selector 545 is a priority coder where the timer strobe signal 412, the count reset signal 440, and the count indicator signal 475 are logically combined. If the timer strobe signal 412 is active (1) and the count reset signal 440, the count indicator signal 475, and an overflow signal are inactive (0), the next count output 460 of the next count selector 545 is the selected count output 535 incremented by a binary '1' with the increment circuit 540. If the timer strobe signal 412, the count reset signal 440, the count indicator signal 475, and the overflow signal are inactive (0), the next count output 460 of the next count selector 545 is the selected count output 535. If the timer strobe signal 412 and the count indicator signal 475 are active (1) and the count reset signal 440 and the overflow signal are inactive (0), the next count output 460 of the next count selector 545 is also the binary '0'. If the count reset is active (1) indicating that the source data 130 has changed and the timer strobe signal 412, the count reset signal 440, the count indicator signal 475, and the overflow signal are inactive (0), the next count output 460 of the next count selector 545 is also the binary '0'. If the count reset is active (1) indicating that the source data 130 has changed and the timer strobe signal 412 is active (1) and the count reset signal 440, the count indicator signal 475, and the overflow signal are inactive (0), the next count output 460 of the next count selector 545 is also the binary '1'.

Figure 7:
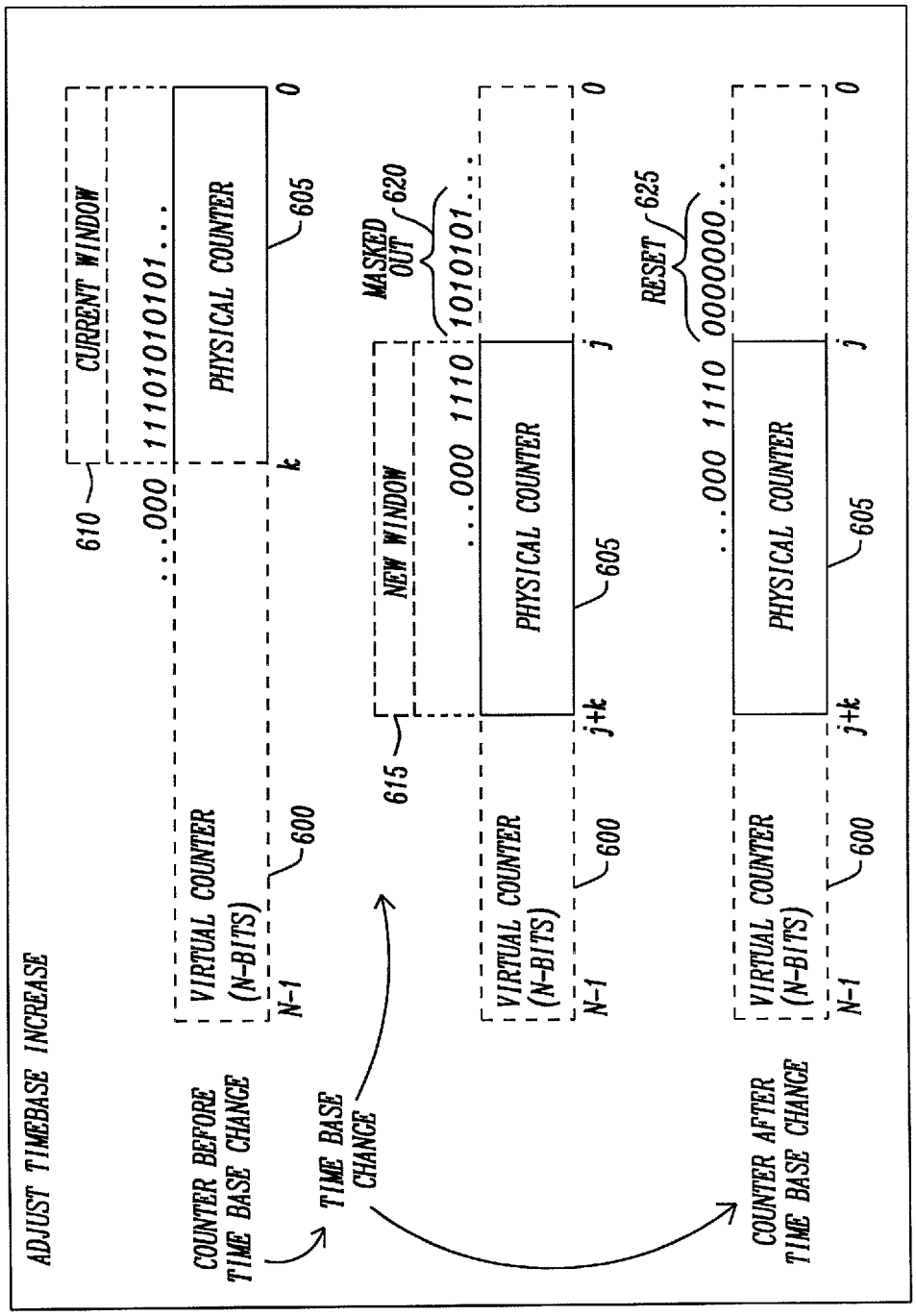
FIG. 7 is a plot showing the structure of a virtual counter and physical counter placed within the virtual counter for increasing the time base of the virtual counter as implemented within a configurable debounce circuit embodying the principals of the present disclosure illustrating an adjustment to increase a time base.

FIG. 7 is a plot showing the structure of a virtual counter and physical counter placed within the virtual counter for increasing the time base of the virtual counter as implemented within a configurable debounce circuit 135 of FIG. 5 illustrating an adjustment to increase a time base. The virtual counter 600 is defined as having a number N bits ranging from the least significant bit (0) to the most significant bit (N−1). In this example the physical counter 605 is initialized to have its origin at the least significant bit of the virtual counter 600. The current window 610 is defined as the present location of the physical counter 605. In this example, the physical counter 605 has been incremented to contain the count (11101010101 . . . ). Referring additionally to FIG. 5, the time base change is defined by the source debounce time 125 and generated by the time base generator 415 for transfer to the N-bit virtual count controller 450. The new window 615 is defined to place the least significant bit of the physical counter 605 (the K-bit count register 455) at the location j. The contents of the physical counter 605 are now ( . . . 000 1110) with the remainder of the previous physical counter 605 is (1010101 . . . ) 620 and is to be masked out to be reset to be (0000000 . . . ) 625. The physical counter 605 is set with it least significant bit at the location j and the counter now incremented based on the timer strobe 412.

Figure 8:
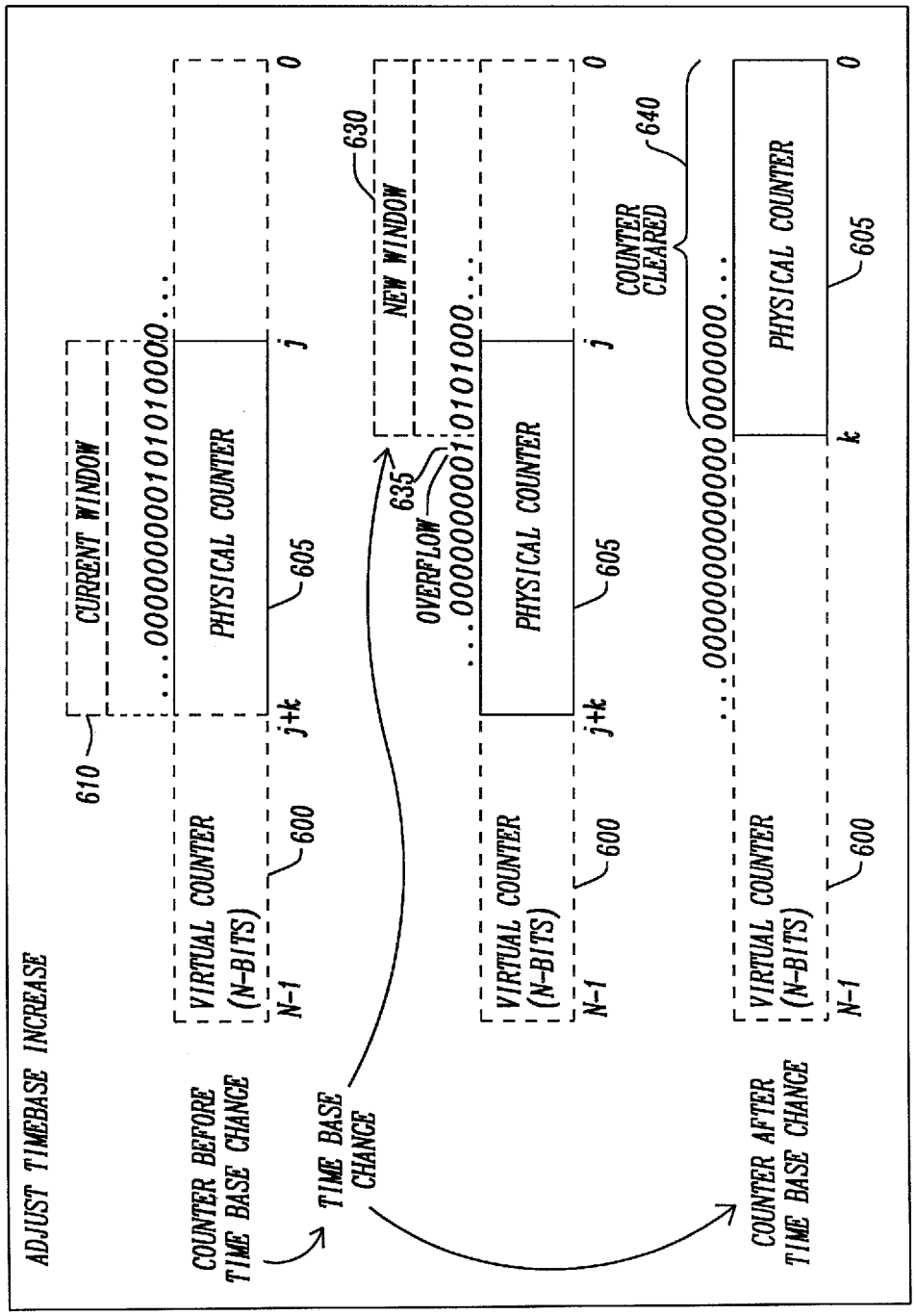
FIG. 8 is a plot showing the structure of a virtual counter and physical counter placed within the virtual counter for decreasing the time base of the virtual counter as implemented within a configurable debounce circuit embodying the principals of the present disclosure illustrating an adjustment to decrease a time base.

FIG. 8 is a plot showing the structure of at virtual counter and physical counter placed within the virtual counter for decreasing the time base of the virtual counter as implemented within a configurable debounce circuit 135 of FIG. 5 illustrating an adjustment to decrease a time base. The virtual counter 600 is defined as having a number N bits ranging from the least significant bit (0) to the most significant bit (N−1). In this example the physical counter 605 has been placed to have the location of its least significant bit at the location j of the virtual counter 600. The current window 610 is defined as the present location of the physical counter 605. In this example, the physical counter 605 has been incremented to contain the count ( . . . 00000000010101). Referring additionally to FIG. 5, as previous described, the time base change is defined by the source debounce time 125 and generated by the time base generator 415 for transfer to the N-bit virtual count controller 450. The new window 630 is defined to place the least significant bit of the physical counter 605 (the K-bit count register 455) at the least significant bit (0) of the virtual counter 600. The contents of the physical counter 605 are now (0101000 . . . ) with the remaining bits of the previous physical counter 605 are ( . . . 0000000001) 635. The remaining bits of the previous physical counter 605 indicate that an overflow has occurred and the contents of the physical counter must now be reset to clear 640 the physical counter 605. The physical counter 605 is set with its least significant bit at the least significant bit (0) of the virtual counter 600 and the counter now incremented based on the timer strobe 412 that will be the base clock CK. As noted above an overflow is easily detected and can only happen when the time base signal 417 is getting smaller and a left shift of the contents of the K-bit count register 455 is implemented. Any '1' bits shifted off the end of the shifter indicate an overflow.

At every cycle of the clock CK, the setting of the time base signal 417 as generated by the time base generator 415 is checked. If a change in the time base is detected, then the location of the new physical count window 615 and 620 within the virtual range is recalculated, as shown in FIGS. 7 and 8. On the next timer strobe 412, the physical counter 620 as implemented by the K-bit count register 455 is incremented with the new window value 615 and 620. Recalculating the physical count value involves overlaying the new window 615 and 620 over the updated count position j, then masking off any bits that lie outside the new window 615 or 620. The bits in the new window 615 or 620 are now taken as the new count slice at the output of the K-bit count register 455. If there any bits that are a binary '1' that appear above the most significant bit position of the new window 620 of the physical counter 605 within the virtual counter, an overflow has occurred and the new debounce time has already been exceeded. The debounce data is allowed to propagate to the debounce data output 490 of FIG. 5 and debounce is complete. If there any bits that are a binary '1' that appear below the least significant bit position of the new window 615 or 620 of the physical counter 605 within the virtual counter, these bits are lost thus resulting in an associated loss of debounce resolution.

To minimize loss of accuracy when the time base is changed the timer strobes 412 should be aligned. For example a system with a 1 kHz clock and three timer strobes has a basic clock CK that is at the active state every 1 ms. The second strobe should occur every 8ms and the third strobe should occur every 64 ms. The timer strobe generator 410 should generate the strobes 412 such that the three strobes 1 ms, 8 ms, and 64 ms are coincident.

In various embodiments, the full range of debounce time values is not required by an application, and a range restriction code y is used to indicate which of a $2^y$ subset of values to select. The range restriction code y can be simply decoded and applied to a selector circuit within the time base generator 415 for supplying the required time base signal 417, timer strobe 412, and threshold value 465 to the N-bit virtual count controller 450.

While this disclosure has been particularly shown and described with reference to the preferred embodiments thereof, it will be understood by those skilled in the art that various changes in form and details may be made without departing from the spirit and scope of the disclosure

What is claimed is:

1. A debounce circuit for eliminating noise, glitches, or transient signal variations resulting from mechanical bounce in electronic or mechanical devices occurring at an initiation of a change of state of at least one analog signals such that the debounce circuit supports a dynamic debounce period alteration and time base variation without loss of the current debounce state, the debounce circuit comprising:
    a physical counter configured for being disposed within a virtual counter defined to have a number of bits sufficient to generate a filter time for filtering the noise, glitches, or transient signal variations resulting from mechanical bounce occurring at an initiation of a change of state of the at least one analog input signal from a source device;
    a debounce clock controller configured for providing a fundamental clock to the physical counter, at least one time base signal indicating a location within the virtual counter that the physical counter is situated within the virtual counter for generating a debounce time to eliminate the noise, glitches, or transient signal variations resulting from mechanical bounce based on a required debounce time of the at least one analog signal, at least one timer strobe configured to be a submultiple of and aligned with the fundamental clock for incrementing the physical counter at the indicated location within the virtual counter such that the least significant binary digit of the physical counter is located at the virtual location in the virtual counter where two raised to the virtual location of the beginning binary digit of physical counter is the submultiple of the clock determining the strobe time, and a debounce threshold indicating a count of the virtual counter at which the debounce time has elapsed; and
    a virtual debounce controller in communication with the physical counter and the debounce controller, configured for defining the location of the physical counter within the virtual counter as defined by the at least one time base signal, and determining when the count of the virtual counter has exceeded the debounce threshold.

2. The debounce circuit of claim 1 further comprising an edge detector in communication with the virtual debounce signal and the physical counter and configured for receiving a selected analog signal, determining that a change of state has occurred in the selected analog signal, and generating a count reset signal indicating a change in state of the selected analog signal, wherein the count reset signal resets the physical counter at each change in state of the selected analog signal until the count of the virtual counter is exceeded.

3. The debounce circuit of claim 1 wherein at the initiating of power to the debounce circuit, the virtual debounce controller initializes the physical counter to a maximum period for the holding the output signal of the debounce circuit from changing state when the selected analog signal from the source device has initiated a change of state of the analog signal.

4. The debounce circuit of claim 3 wherein subsequent to the initiating the physical counter to the maximum period, the physical counter is transferred to the location within the virtual counter for providing the necessary delay for filtering the noise, glitches, or transient signal variations resulting from mechanical bounce occurring at an initiation of a change of state of the analog signals.

5. The debounce circuit of claim 3 wherein the change in state of the input analog signal is detected, the physical counter is reset, the output of the debounce circuit is compared with the analog input signal from the source device, and when the output of the debounce circuit and the analog input signal are not the same, the debounce circuit determines if an overflow occurred when the relocation of the physical counter has occurred within the virtual counter or the contents of the physical counter was equal to or greater than the threshold time, when an overflow did not occur or the contents of the physical counter were not equal to or greater than the threshold time, the physical counter is incremented.

6. The debounce circuit of claim 3 wherein when the state of the input analog signal is not changing, the strobe signal is examined to determine it is at the active state, and when it is at the active state, the debounce circuit examines debounce parameters to determine if the debounce threshold determining the maximum count of the physical counter is changed and the strobe time is modified when the debounce parameters are changed.

7. The debounce circuit of claim 6 wherein when an initial pass after the initialization at the activating the power to the circuit occurs, device configuration is changed unless the debounce parameters are designated to be at the longest possible debounce time.

8. The debounce circuit of claim 6 wherein with the change in debounce parameters, the debounce threshold is updated and the physical counter is relocated appropriately within the virtual counter based on the time base of the noise, glitches, or transient signal variations resulting from mechanical bounce occurring at an initiation of a change of state of an analog input signal of the source device.

9. The debounce circuit of claim 5 wherein when the debounce parameters have changed and an overflow did occur, the new data from the analog signal is transferred to the output of the debounce circuit and the physical counter is reset.

10. The debounce circuit of claim 3 wherein the debounce circuit cycles through the detecting an edge when the strobe is an active state and incrementing the counter until the debounce parameters change and there is an overflow or the physical counter is equal to or greater than the threshold value.

11. An electronic system comprising:
    at least one electronic or mechanical signal source generating noise, glitches, or transient signal variations resulting from mechanical bounce when the at least one electronic or mechanical signal source changes a state of an analog output signal of the at least one electronic or mechanical signal source;
  a debounce circuit for the eliminating noise, glitches, or transient signal variations resulting from mechanical bounce occurring at an initiation of the change of state of the analog output signal of one selected electronic or mechanical signal source that supports a dynamic debounce period alteration and time base variation without loss of the current debounce state, comprising:
    a physical counter configured for being disposed within a virtual counter defined to have a number of bits sufficient to generate a filter time for filtering the noise, glitches, or mechanical bounce occurring at the initiation of the change of state of the analog output signal from the selected electronic or mechanical signal source;
    a debounce clock controller configured for providing a fundamental clock to the physical counter, at least one time base signal indicating a location within the virtual counter that the physical counter is situated within the virtual counter for generating a debounce time for eliminating the noise, glitches, or mechanical bounce based on a required debounce time of the selected analog output signal, at least one timer strobe configured to be a submultiple of and aligned with the fundamental clock for incrementing the physical counter at the indicated location within the virtual counter such that the least significant binary digit of the physical counter is located at the virtual location in the virtual counter where two raised to the virtual location of the beginning binary digit of physical counter is the submultiple of the clock determining the strobe time, and a debounce threshold indicating a count of the virtual counter at which the debounce time has elapsed; and
    a virtual debounce controller in communication with the physical counter and the debounce clock controller, configured for defining the location of the physical counter within the virtual counter as defined by the at least one time base signal, and determining when the count of the virtual counter has exceeded the debounce threshold.

12. The electronic system of claim 11 wherein the electronic system comprises
  a plurality of electronic or mechanical signal sources generating noise, glitches, or transient signal variations resulting from mechanical bounce when a selected one electronic or mechanical signal source of the plurality of electronic or mechanical signal sources changes a state of an analog output signal of each of the plurality of electronic or mechanical signal sources; and
  further comprising a selector configured for receiving the output signal of each of the electronic or mechanical signal sources and configured for receiving a select signal encoded for selecting one of the analog output signals to be transferred to an output of the selector for transmitting to an input of the debounce circuit.

13. The electronic system of claim 11 wherein the debounce circuit further comprises an edge detector in communication with the virtual debounce signal and the physical counter and configured for receiving a selected analog signal, determining that a change of state has occurred in the selected analog signal, and generating a count reset signal indicating a change in state of the selected analog signal, wherein the count reset signal resets the physical counter at each change in state of the selected analog signal until the count of the virtual counter is exceeded.

14. The electronic system of claim 11 wherein at the initiating of power to the debounce circuit, the virtual debounce controller initializes the physical counter to a maximum period for the holding the output signal of the debounce circuit from changing state when the selected analog signal from the source device has initiated a change of state of the analog signal.

15. The electronic system of claim 14 wherein subsequent to the initiating the physical counter to the maximum period, the physical counter is transferred to the location within the virtual counter for providing the necessary delay for filtering the noise, glitches, or mechanical bounce occurring at an initiation of a change of state of the analog signals.

16. The electronic system of claim 14 wherein the change in state of the input analog signal is detected, the physical counter is reset, the output of the debounce circuit is compared with the analog input signal from the source device, and when the output of the debounce circuit and the analog input signal are not the same, the debounce circuit determines if an overflow occurred when the relocation of the physical counter has occurred within the virtual counter or the contents of the physical counter was equal to or greater than the threshold time, when an overflow did not occur or the contents of the physical counter were not equal to or greater than the threshold time, the physical counter is incremented.

17. The electronic system of claim 14 wherein when the state of the input analog signal is not changing, the strobe signal is examined to determine it is at the active state, and when it is at the active state, the debounce circuit examines debounce parameters to determine if the debounce threshold determining the maximum count of the physical counter is changed and the strobe time is modified when the debounce parameters are changed.

18. The electronic system of claim 17 wherein when an initial pass after the initialization at the activating the power to the circuit occurs, device configuration is changed unless the debounce parameters are designated to be at the longest possible debounce time.

19. The electronic system of claim 17 wherein with the change in debounce parameters, the debounce threshold is updated and the physical counter is relocated appropriately within the virtual counter based on the time base of the noise, glitches, or mechanical bounce occurring at an initiation of a change of state of an analog input signal of the source device.

20. The electronic system of claim 16 wherein when the debounce parameters have changed and an overflow did occur, the new data from the analog signal is transferred to the output of the debounce circuit and the physical counter is reset.

21. The electronic system of claim 14 wherein the debounce circuit cycles through the detecting an edge when the strobe is an active state and incrementing the counter until the debounce parameters change and there is an overflow or the physical counter is equal to or greater than the threshold value.

22. A method for eliminating noise, glitches, or transient signal variations resulting from mechanical bounce from electronic or mechanical signal source occurring at an initiation of a change of state of at least one analog signals that supports a dynamic debounce period alteration and time base variation without loss of the current debounce state, comprising the steps of:

providing physical counter;

configuring the physical counter for being disposed within a virtual counter defined to have a number of bits sufficient to generate a filter time for filtering the noise, glitches, or transient signal variations resulting from mechanical bounce of the electronic or mechanical signal source occurring at an initiation of a change of state of the at least one analog input signal from a source device;

generating a debounce clock providing a fundamental clock to the physical counter, at least one time base signal indicating a location within the virtual counter that the physical counter is situated for generating the debounce time to eliminate the noise, glitches, or transient signal variations resulting from mechanical bounce based on a required debounce time of one selected analog signal, at least one timer strobe configured to be a submultiple of and aligned with the fundamental clock for incrementing the physical counter at the indicated location within the virtual counter, and a debounce threshold indicating a count of the virtual counter at which the debounce time has elapsed;

defining the location of the physical counter within the virtual counter by the at least one time base signal such that the least significant binary digit of the physical counter is located at the virtual location in the virtual counter where two raised to the virtual location of the beginning binary digit of physical counter is the submultiple of the clock determining the at least one timer strobe; and determining when the count of the virtual counter has exceeded the debounce threshold.

23. The method of claim 22 further comprising the steps of:

determining that a change of state has occurred with the selected analog signal, and generating a count reset signal indicating a change in state of the selected analog signal; and resetting the physical counter at each change in state of the selected analog signal with the count reset signal until the count of the virtual counter is exceeded.

24. The method of claim 22 further comprising the step of initializing the physical counter to a maximum period for the holding the output signal of the debounce circuit from changing state when the selected analog signal from the source device has initiated a change of state of the analog signal.

25. The method of claim 24 further comprising the step of transferring the physical counter to the location within the virtual counter for providing the necessary delay for filtering the noise, glitches, or transient signal variations resulting from mechanical bounce occurring at an initiation of a change of state of the selected analog signal, subsequent to the initiating the physical counter to the maximum period.

26. The method of claim 24 further comprising the step of:
resetting the physical counter, upon detecting the change in state of the input analog signal.

27. The method of claim 24 further comprising the steps of:

comparing a previous state of the analog input signal with a current analog input signal; and resetting the physical counter, when the previous state of the analog input signal and the current analog input signal are equal.

28. The method of claim 24 further comprising the steps of:

determining if debounce parameters are changed to relocate the physical counter within the virtual counter;

determining if an overflow has occurred; when the physical counter is relocated within the virtual counter; and incrementing the physical counter, when the overflow did not occur.

29. The method of claim 28 further comprising the steps of:

transmitting the analog input signal to external circuitry, when the overflow did occur; and resetting the physical counter.

30. The method of claim 24 further comprising the steps of:

determining if the contents of the physical counter are equal to or greater than the threshold time; and incrementing the physical counter, when the physical counter is not equal to or greater than the threshold time.

31. The method of claim 30 further comprising the steps of:

transmitting the analog input signal to external circuitry, when the physical counter is equal to or greater than the threshold time.

32. The method of claim 28 further comprising the step of:
modifying the debounce threshold determining the maximum count of the physical counter, modifying the strobe time, and relocating the physical counter within the virtual counter when the debounce parameters are changed.

33. The method of claim 28 further comprising the step of:
changing the debounce configuration at an initial pass through the method after the initialization at the activating the power.

34. The method of claim 31 further comprising the step of cycling through the method each change of state that occurs with the selected analog signal.

* * * * *